United States Patent [19]
O'Brien et al.

[11] Patent Number: 5,796,985
[45] Date of Patent: Aug. 18, 1998

[54] METHOD AND APPARATUS FOR INCORPORATING A MILLER COMPENSATION FOR MODELING ELECTRICAL CIRCUITS

[75] Inventors: Peter R. O'Brien, Austin; Richard Paul Wiley, Round Rock, both of Tex.

[73] Assignee: Motorola, Inc., Schaumburg, Ill.

[21] Appl. No.: 639,393

[22] Filed: Apr. 29, 1996

[51] Int. Cl.$^6$ .................................... G06F 17/50
[52] U.S. Cl. .................. 395/500; 364/488; 364/490; 364/578
[58] Field of Search .................... 364/488, 489, 364/490, 491, 578; 395/500

[56] References Cited

PUBLICATIONS

Green, "An Improved Miller Effect Model for High-Frequency Behavior", IEEE Trans of Ed., vol. E28 No. 3, pp. 125–130, Aug. 1985.
Trotten et al., "Macromodeling CMOS Circuits for Event Driven Simulation", ASIC Conf & ExC. IEEE, pp. 174–177, 1994.
Shih et al., "New Simulation Methods for MOS VLSI Timing & Reliability", 1991 Int'l Conf. on CAD, pp. 162–165.
Shih et al., "ILLIADS: A fast timing & reliability Simulator for Digital MOS Circuits", IEEE Trans on CAD, vol. 12 No. 9, pp. 1387–1402, Sep. 1993.
Shih et al., "A New MOS Circuits Primitive for Fast Timing Simulations", 1991 IEEE Int'l Symp. on Circuits & Systems, pp. 2391–2394.
Brambilla et al., "Algorithm to simulate periodically switched power circuits in the time domain", Electronics Letters, vol. 30 No. 17, pp. 1367–1368, Aug. 1994.
Brambilla et al., "A New Technique for Transient Analysis of Periodically Switched Circuits", 1995 IEEE Int'l Symp. on Circuits & Systems, pp. 2177–2180.
Shih et al., "Analytic Transient Solution of General MOS Circuits Primitives" IEEE Trans on CAD, vol. 11 No. 6, pp. 719–731, Jun. 1992.
Richman, Paul, "MOS Field–Effect Transistors and Integrated Circuits," Wiley–Interscience Publication, pp. 173–175 (1973).
Ousterhout, John K., "A Switch–Level Timing Verifier for Digital MOS VLSI," IEEE, vol. CAD–4 No. 3, Transactions on Computer–Aided Design, pp. 336–349 (1985).
Press, et al., "Numerical Recipes in C.The Art of Scientific Computing," Cambridge University Press, Chapter 9, pp. 255–263 (1989).
Ralston, et al., "A First Course in Numerical Analysis, " McGraw–Hill, Second Edition, Chapter 6, pp. 247–263 (1978).
Kong, et al., "Methods to Improve Digital MOS Macromodel Accuracy," IEEE, vol. 14, No. 7, Transactions on Computer–Aided Design of Integrated Circuits & Systems, pp. 868–881, (1995).

(List continued on next page.)

*Primary Examiner*—Kevin J. Teska
*Assistant Examiner*—Tyrone V. Walker
*Attorney, Agent, or Firm*—Sandra L. Godsey

[57] ABSTRACT

A data processing system which calculates timing delays in a circuit having a switching device (3). A computer processor (22) receives input describing a circuit and calculates the timing delays for each switching device (3) or stage. To perform each calculation the computer processor (22) models the circuit incorporating effective resistance $R_{eff}$ (24), Miller capacitance $C_\mu$ (7), and an associated Miller coefficient. The Miller coefficient is a defined by the behaviour of the model. The model is then reduced to a set of equations, the variables are determined, and the timing delay calculated. In one embodiment, successive stages are calculated to locate timing violations in circuit design. In alternate embodiments, models such as CRYSTAL (4) or the Sakurai model are enhanced by Miller capacitance considerations, however many other models may be used.

27 Claims, 6 Drawing Sheets

PUBLICATIONS

EPIC, "PathMill User Manual", Release 3.1, pp. 4-27-4-28, (1994).

Sakurai, et al., "Alpha-Power Law MOSFET Model and its Applications to CMOS Inverter Delay and Other Formulas," IEEE, vol. 25, No. 2, Journal of Solid-State Circuits, pp. 584-594 (1990).

1

METHOD AND APPARATUS FOR INCORPORATING A MILLER COMPENSATION FOR MODELING ELECTRICAL CIRCUITS

FIELD OF THE INVENTION

The present invention relates in general to a timing analysis system, and more particularly to a method of estimating time delays in a timing analysis system.

BACKGROUND OF THE INVENTION

Timing analysis is used in circuit design to accurately determine the interaction of the components of a system. Often, timing analysis determines the best path for a designer to pursue, or helps to optimize the overall circuit design. In digital circuits, notably, timing considerations can be critical to proper performance. Timing analysis of complex systems involves modeling based on assumptions and approximations. The nature of a given circuit or system and its application will determine the model used and the assumptions and the approximations employed. Timing analyzers modeled to MOSFET-level, decompose a circuit to its component transistor level, which is a refinement of gate-level timing analyzers.

Typically, calculations reduce an electrical or electronic circuit to some equivalent resistor-capacitor (R-C) model. Designers are typically familiar with R-C models, understanding the equations describing their operation. Additionally, R-C models are generally easy to define, with known input-output (IO) relationships. Models attempt to simplify the complex relationships that describe, and difficult equations that define actual circuits. A model, however accurate, is only an approximation of the actual relationships of a circuit. A robust model, therefore, is one that consistently describes a wide range of operating environments. A robust model offers reliable predictions for future timing calculations.

MOSFET-level models are typically R-C models based on physical characteristics, in contrast to gate-level models which are represented by empirical formula or lookup tables. A popular switch-level model, the "CRYSTAL" model, decomposes a circuit into switches or stages and uses a resistor-switch model based on rise time ratios. The "CRYSTAL" model is described in "A Switch-Level Timing Verifier for Digital MOS VLSI" by J. Ousterhout, IEEE Transactions on Computer-Aided Design, Vol. CAD-4, No. 3, July 1985, which is hereby expressly incorporated by reference. New generation MOSFET-level timing analyzers may also use non-linear resistors based on static I-V curves, such as the Sakurai model. The Sakurai model is descibed in "Alpha-Power Law MOSFET Model and its Applications to CMOS Inverter Delay and Other Formulas" by T. Sakurai and A. Newton, IEEE Journal of Solid-State Circuits, Vol. 25, No. 2, April 1990, which is hereby expressly incorporated by reference.

Models tend to reflect the salient characteristics of a given circuit or type of circuit, ignoring less significant effects of individual components. As models prove effective, designers tend to rely on them and apply them to a range of circuits and applications. However, as the application or operating environment changes, ignored effects may become significant. For example, an insignificant effect at low frequency may become debilitating at high frequency. As technologies progress, they may gain this heightened sensitivity.

The modeling of electronic circuits is an example of the increased sensitivity of technological advances. Traditional electronic circuit models are accurate for low frequency stimulus, which reduce to a simple RX circuit, ignoring high frequency effects such as the Miller effect. As electronic circuits advance, the trend is to smaller technologies operating at ever higher frequencies. High frequency devices have increased sensitivity to many of the ignored effects in earlier models. To accurately model circuits that operate at these higher frequencies requires a more accurate method of modeling effects.

DESCRIPTION OF PREFERRED EMBODIMENT

The present invention offers a method of modeling circuits and estimating time delays associated with such circuits. Often models include capacitive devices to describe the characteristics of a circuit. At high frequencies, capacitive devices produce significant effects on the timing of a given circuit. Many models fail to incorporate all significant capacitance devices, and fail to accurately model the circuit at high frequency. Additionally, there are many other operating conditions and manufacturing features which produce significant effects on the characteristic of a circuit. A robust model is one that consistently accounts for significant effects.

Figure 3:
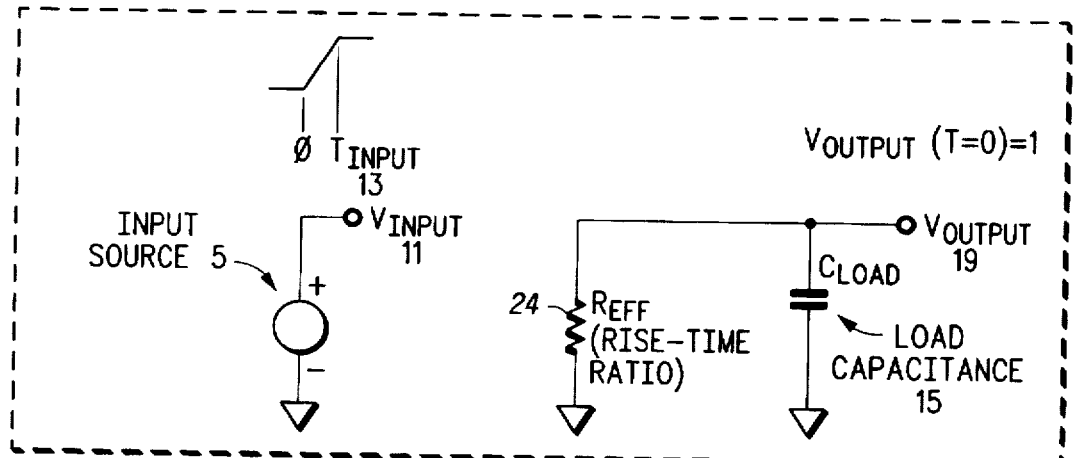
FIG. 3 illustrates, in circuit diagram form, a circuit model used for timing analysis.
Figure 4:
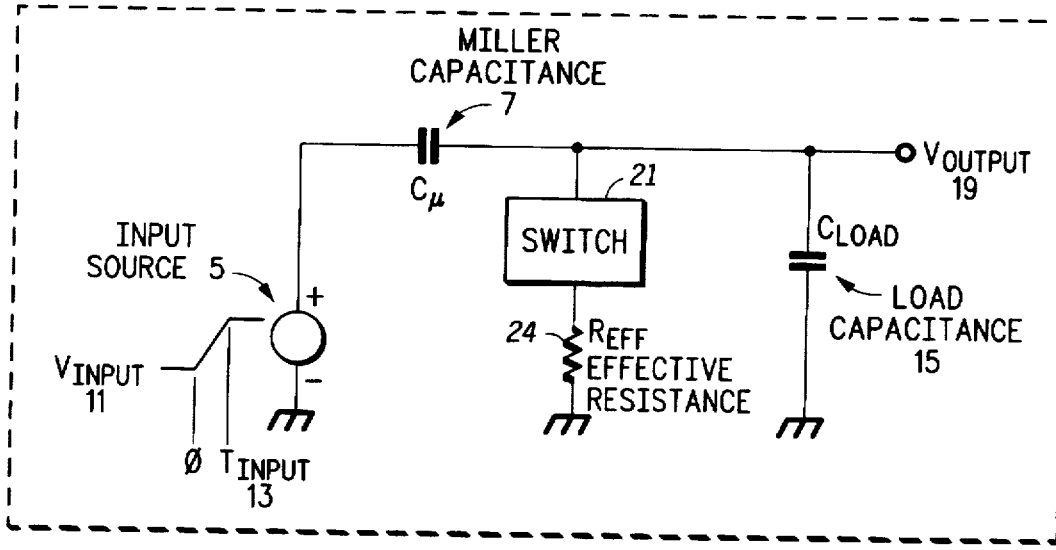
FIG. 4 illustrates, in circuit diagram form, a circuit model used for timing analysis in accordance with one embodiment of the present invention.

Switching devices are used in most electrical and electronic circuits. A switching device, illustrated in FIG. 1, can be modeled by an RX circuit, such as illustrated in FIGS. 3–4. However, most of the common models are static models, which ignore the Miller capacitive effects of the circuit.

In MOS circuits, for example, the floating capacitance between the gate and drain nodes of a switching transistor is called the "Miller" capacitance. The Miller effects in MOS circuits result in overshoot and extra delay in the output voltage at the drain. Two conditions tend to pronounce the Miller effect in MOS circuits, increased speed of switching at the gate, and/or lessened capacitive load at the drain. The Miller effect is significant in many MOS circuits.

Figure 2:
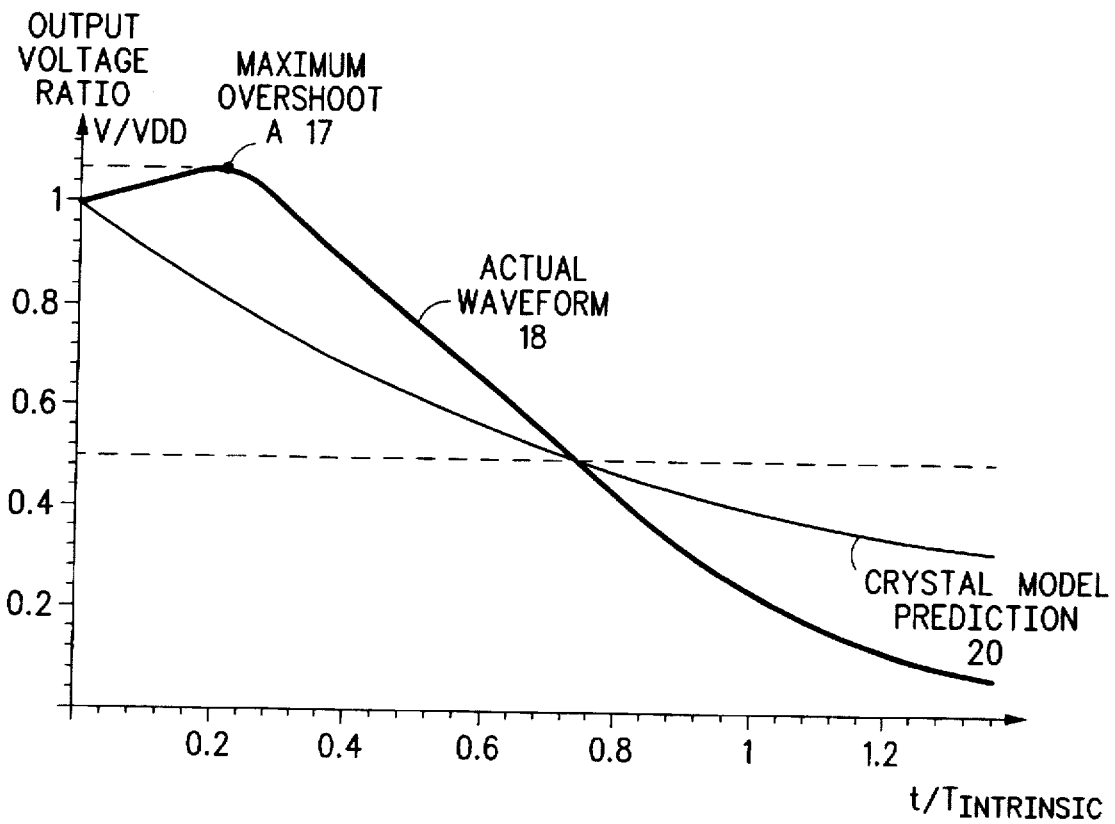
FIG. 2 illustrates, in timing diagram form, a waveform in accordance with one embodiment of the present invention.

The Miller effect describes the exaggerated response caused by effective capacitance at high frequency. Low frequency models do not include this capacitance as its effect is negligible at low frequency. However, the Miller effect is significant at high frequencies. The Miller effect is illustrated in FIG. 2. where overshoot, delay, and slope differences are easily recognized.

Note that the Miller effect is significant in many types of circuits including digital and analog type circuits. By incorporating the Miller effect into timing analysis calculations, a designer can better estimate time delays.

Description of Figures

Timing analysis models are used to model the behavior of circuits, key to which are switching devices. In one embodiment of the present invention, illustrated in FIG. 1, stage 3 has a basic MOS switching device, where input source 5 provides a ramp input as a function of input time ($T_{input}$) 13, (i.e. ramp input with rail to rail switch time of $T_{input}$.) In one embodiment, the switching device is transistor 9 which receives input voltage ($V_{input}$) 11 from input source 5. Transistor 9 is then coupled to load capacitance ($C_{load}$) 15. The output voltage of the switching device is $V_{output}$ 19, and is measured across $C_{load}$ 15. In other embodiments, the switching device may be composed of other components.

FIG. 2 graphically illustrates one example of the Miller effects experienced in stage 3. (see FIG. 1.) The vertical axis represents output voltage unitized by supply voltage, Vdd. The horizontal axis represents time unitized by $T_{intrinsic}$. Note that in one embodiment $T_{intrinsic}$ is equal to the rail to rail extrapolation of 20%–80% output switch time in response to a step input. The resultant actual output includes Miller capacitance effects and is represented by actual waveform 18.

CRYSTAL model prediction 20 illustrates the results of one embodiment where the CRYSTAL model is used to model stage 3. Actual waveform 18 overshoots CRYSTAL model prediction 20 and is maximum at maximum overshoot point A 17. As seen in FIG. 2, differences between an actual output and a model result demonstrate the need for accurate models. Note that the Miller effects are typically less pronounced in low frequency switching devices.

FIG. 3 illustrates a modeling of stage 3, model 4, based on a CRYSTAL model. The output characteristic prediction is illustrated as CRYSTAL model prediction 20 in FIG. 2. Input source 5 provides a ramp input, where rail to rail switch time is $T_{input}$ 13. $R_{eff}$ 24 and $C_{load}$ 15 are coupled to each other and then in parallel are coupled to ground. Output voltage, $V_{output}$ 19 is defined in terms of voltage across $C_{load}$ 15. Note that there are many other configurations and models that represent switching devices. The present invention is applicable to a variety of models. The CRYSTAL model is used as one example, to demonstrate one application of the present invention.

Referring to FIG. 4, in one embodiment of the present invention, model 6, is an alternate modeling of stage 3. Here output voltage, $V_{output}$ 19 is defined in terms of voltage across $C_{load}$ 15 (i.e. across the series combination of switch 21 and $R_{eff}$ 24.) In model 6, of FIG. 4, transistor 9 (see FIG. 1) is replaced with switch 21 and effective resistance $R_{eff}$ 24. Miller capacitance 7 is coupled between input source 5 and output node $V_{output}$ 19, where input source 5 provides a step input as a function of input time ($T_{input}$) 13, (i.e. step input, defined in terms of time (t), where u(t)=0 for t<$T_{input}$ and u(t)=$V_{dd}$ for t>$T_{input}$.) Switch 21 is defined as:

OFF for $0 \leq t \leq \alpha\, T_{input}$

ON for $\alpha\, T_{input} < t$ where α 8 is used to model the time of occurrence of maximum overshoot as a fraction of input switching time. Note that α 8 is defined by the characteristics of the circuit. Effective linear resistance ($R_{eff}$) 24 is placed between switch 21 and ground. Output voltage, $V_{output}$ 19 is defined as voltage across $C_{load}$ 15.

Figure 5:
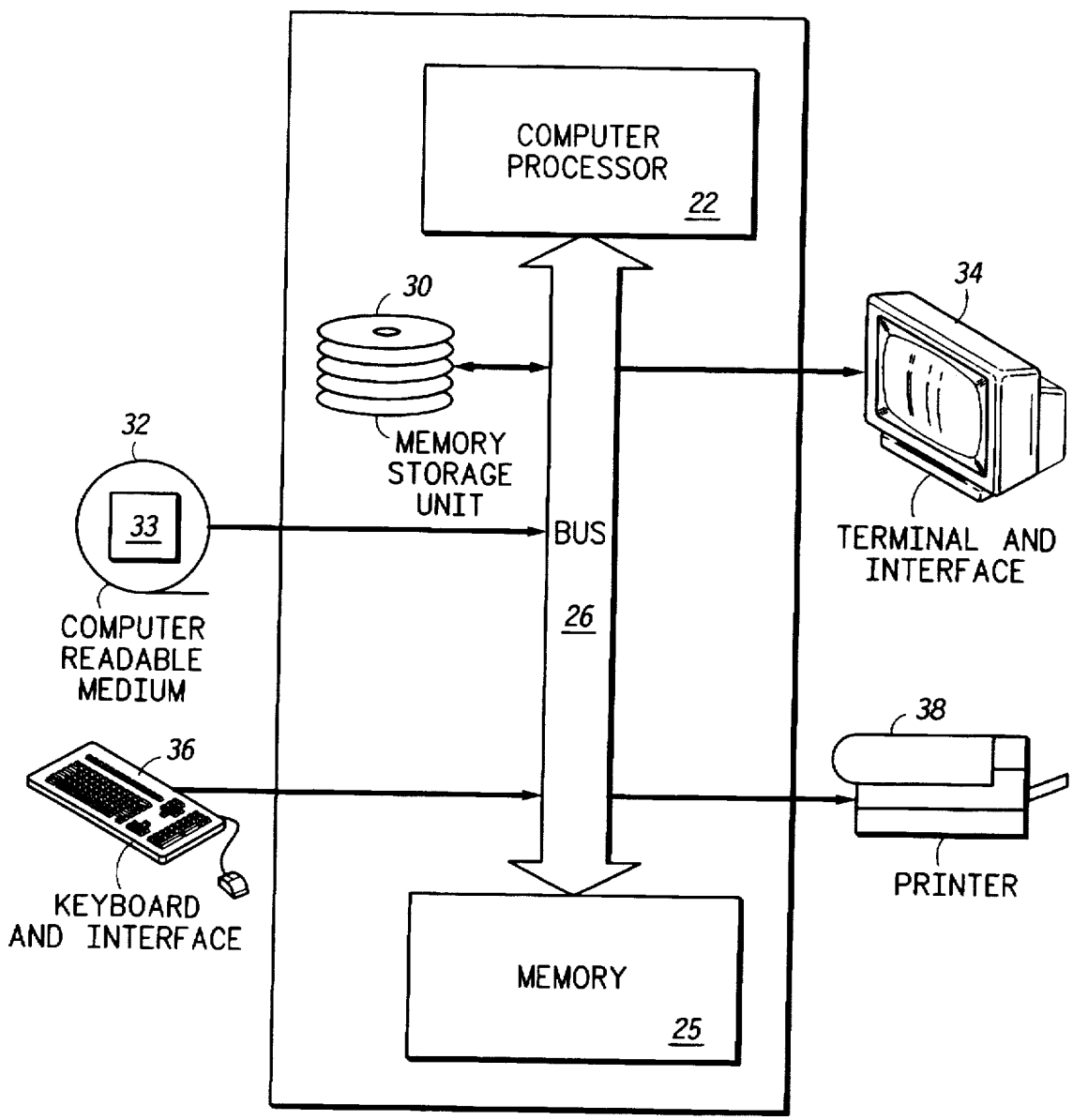
FIG. 5 illustrates, in block diagram form, a computer system in accordance with one embodiment of the present invention.

Current modeling of circuits is done by computer simulation. In one embodiment of the present invention, illustrated in FIG. 5, computer processor 22 communicates bi-directionally with memory 25, and memory storage unit 30 by way of bus 26. Computer processor 22 receives data and information from computer readable medium 32, which contains program information 33. The user communicates with computer processor 22 by keyboard and interface 36, which provides inputs via bus 26. Computer processor 22 transmits information to terminal and interface 34, and printer 38 via bus 26. In one embodiment of the present invention, computer processor 22 receives circuit description information from computer readable medium 32, and in response sends data to terminal and interface 34. Additional information may be input at keyboard and interface 36. Computer processor 22 calculates timing delays for the circuit. Other embodiments have various configurations for computer processor 22 to receive circuit information and data, and to transfer and/or store calculation results.

Figure 6:
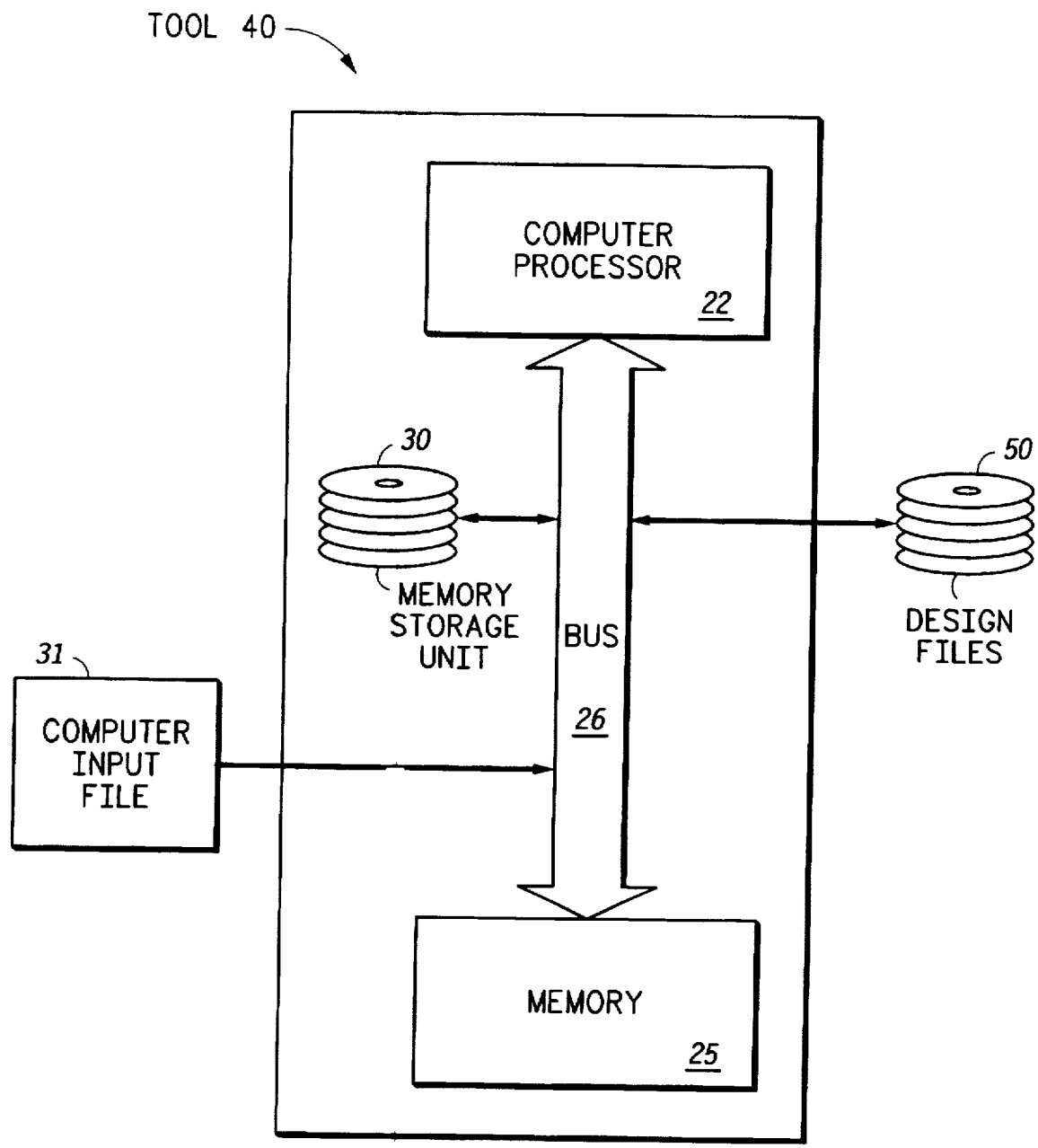
FIG. 6 illustrates, in block diagram form, a timing analysis and design system in accordance with one embodiment of the present invention.

FIG. 6 illustrates one embodiment of the present invention, a circuit design tool 40, where computer processor 22 communicates bi-directionally with memory storage unit 30, computer input file 31, and memory 25 by way of bus 26. In one embodiment, circuit design tool 40 includes hardware for input of circuit parameters, terminal, printer, and any other combination of hardware for circuit design. In one embodiment, circuit design tool 40 communicates with design files 50 by way of bi-directional conductors.

Figure 7:
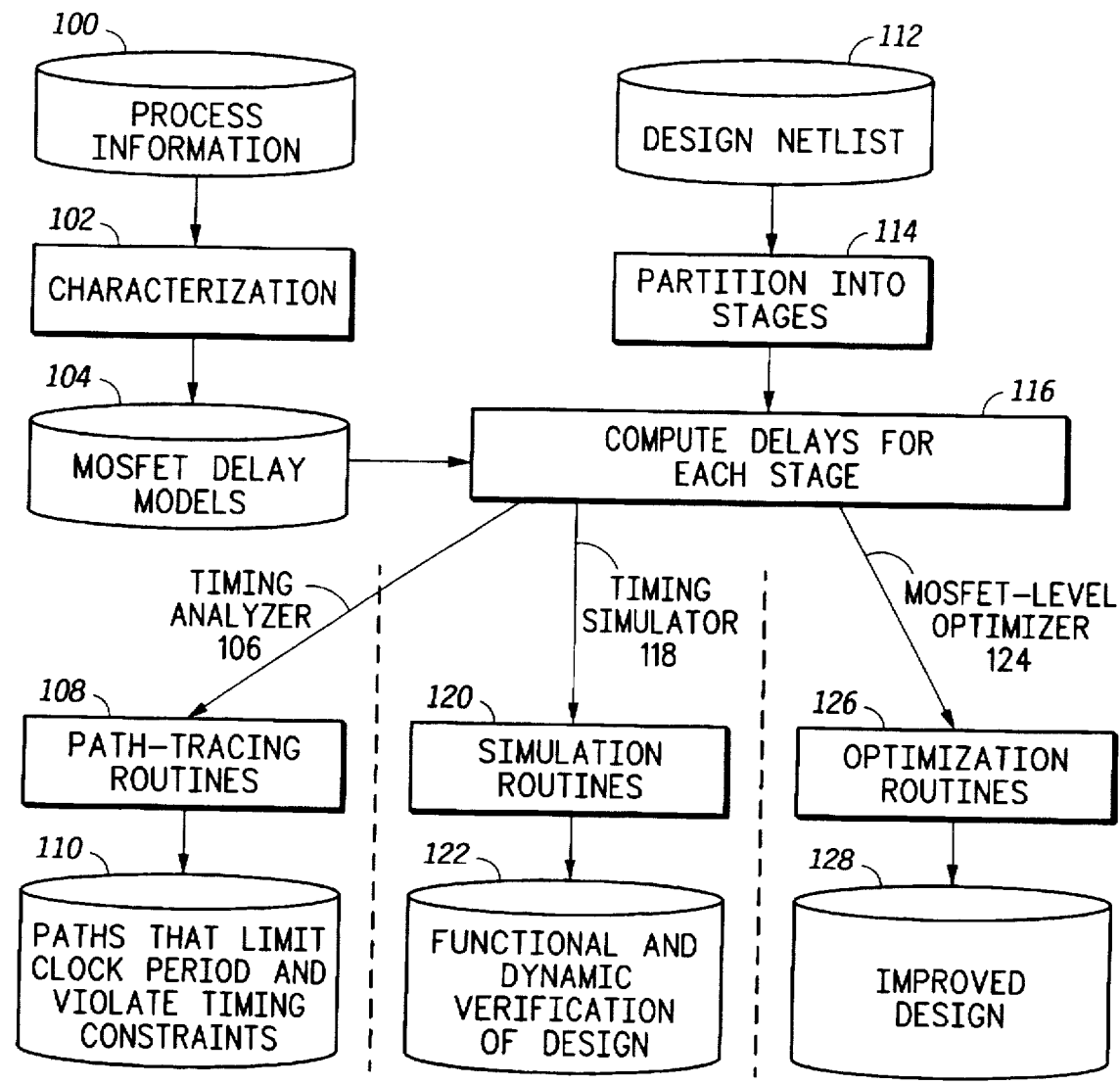
FIG. 7 illustrates, in flow chart form, calculations in accordance with one embodiment of the present invention.

Circuit design is a large endeavor, covering a vast array of technologies and applications. Circuit designers are often limited by the abilities of design tools. A circuit design typically involves many types of calculations, one of which is the calculation of timing delays at each stage or switching device. For clarity. FIG. 7 illustrates a method for calculating timing delays and applying results to circuit design. Flattened oval topped blocks 100, 104, and 112 represent integral points where processing could start, or continue from another section, or jump to another section. Rectangles 102, 108, 114, 116, 120, and 126 represent intermediate steps. Flattened oval topped blocks 110, 112, and 128 represent integral points where processing could jump to another section or yield results.

Figure 8:
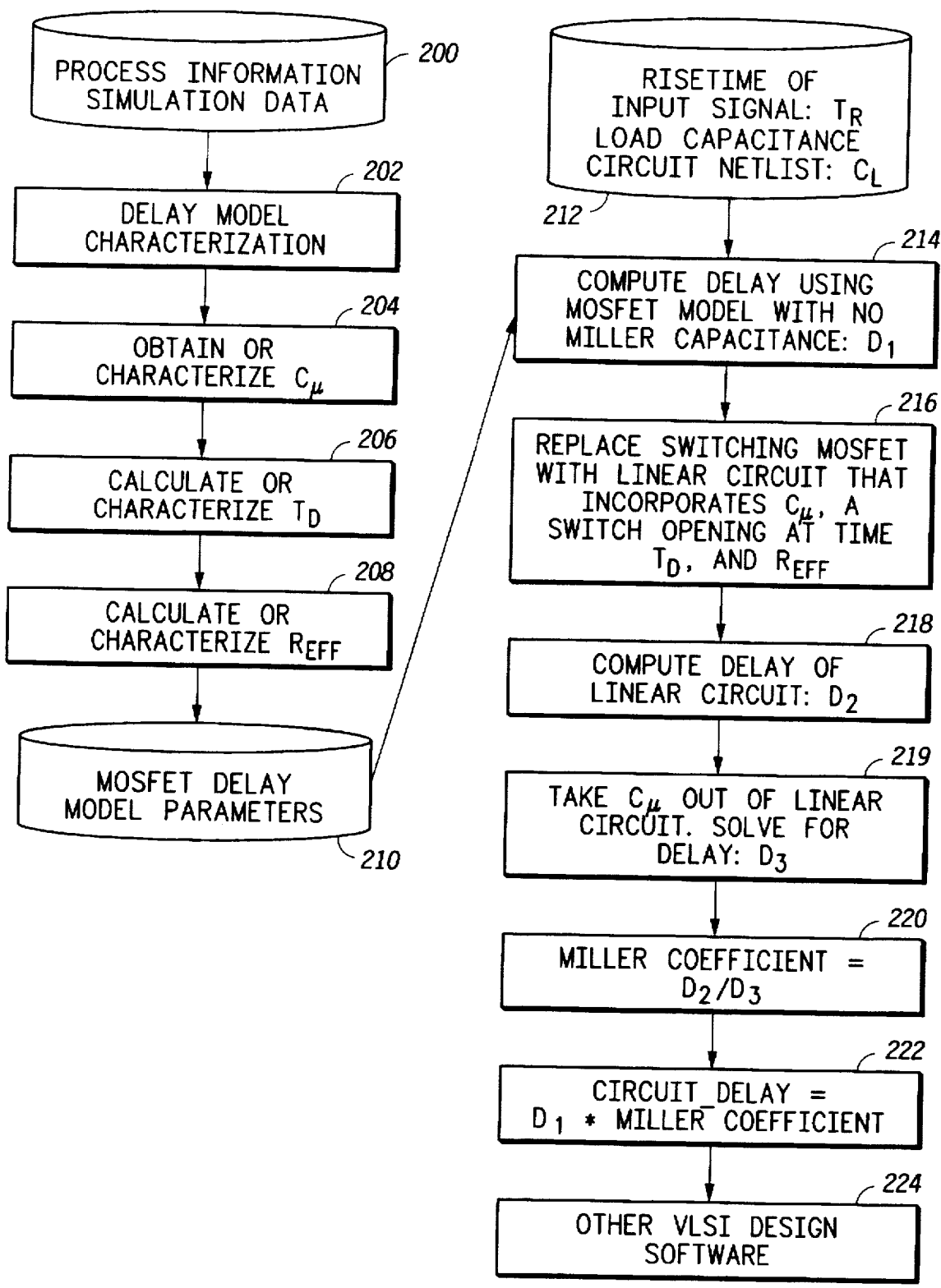
FIG. 8 illustrates, in flow chart form, calculations in accordance with one embodiment of the present invention.

FIG. 8 illustrates, in flow diagram form, a method for calculating timing delays generally, using one embodiment of the present invention. Flattened oval topped blocks 200, and 212 represent integral points where processing could start, continue from another section. Rectangles 202, 204, 206, 208, 214, 216, 218, 220, 222, and 224 are intermediate steps. Flattened oval topped block 210 represents an integral point where processing could stop, or jump to another section.

In one embodiment of the present invention, the general processing flow described in FIG. 8 is applicable to any number of models. Initially, a characterization is done to determine the Miller capacitance, $C_\mu$ 7, the time at which the switch opens, Td, and the effective resistance, $R_{eff}$ 24, for a given MOSFET model. These values are then applied to the MOSFET model. A first calculation is done to determine delay, $D_1$, without considering Miller effects. Then the switching MOSFET is replaced with a linear circuit, having a switch which opens at $T_d$, and having an effective resistance, $R_{eff}$ 24. The Miller capacitance, $C_\mu$ 7, is incorporated into the linear circuit, so as to introduce the Miller effects. Using the linear circuit, modified to include $C_\mu 7$, delay, $D_2$, is calculated. The Miller capacitance, $C_\mu 7$, is removed from the linear circuit and a third delay, $D_3$, is calculated. An adjustment factor is defined as the ratio of $D_2$ to $D_3$. Future calculations of circuit delay are found as a function of $D_1$ and the adjustment factor. Circuit delay is then available for further processing. Note that this basic flow may be applied to any number of MOSFET models.

Operation of Preferred Embodiment

The present invention offers a method of incorporating dynamic parameters into a switch level model. The parameters are used to model the Miller effect in a switching circuit. In one embodiment of the present invention, the model reduces to at least one equation, where conceptually, the circuits illustrated in FIG. 3 and FIG. 4 are reduced to defining equations.

There are various methods for determining the values of those parameters for a given circuit. The dynamic parameters allow for a sensitive modeling of high frequency circuits. In one embodiment of the present invention, parameter determination is done by circuit simulation allowing for consistent, robust results. As semiconductor technology increasingly reduces in size, high frequency models become critical to circuit simulation tools. It is advantageous to provide robust, accurate models for high frequency designs. The present invention offers a method of robust, accurate modeling of high frequency circuits.

Figure 1:
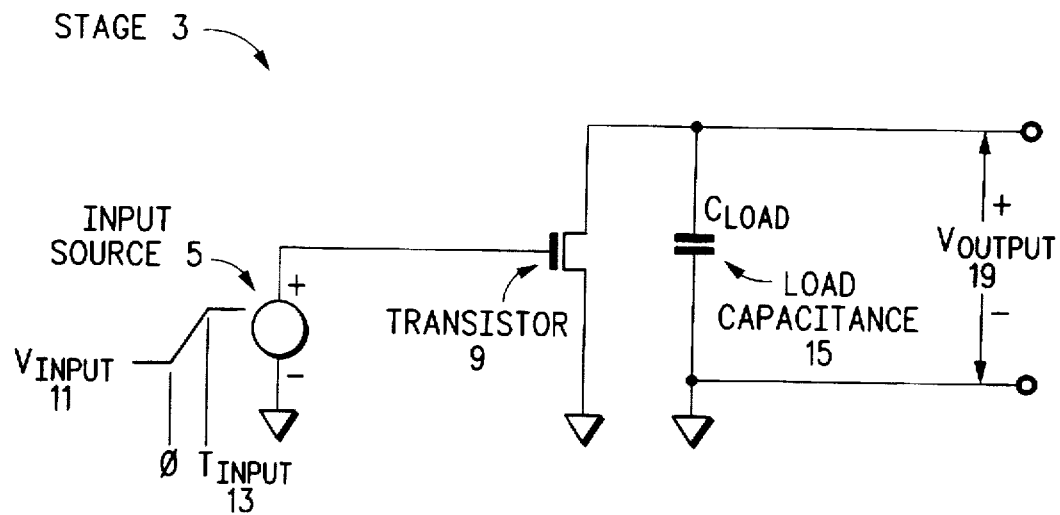
FIG. 1 illustrates, in circuit diagram form, a circuit in accordance with one embodiment of the present invention.

Timing analysis and timing analysis programs consider a wide variety of circuits. Many assumptions and approximations are made regarding the circuit and its relationships. Fundamental to MOSFET-level timing analysis is the switching device. A device, as illustrated in FIG. 1, exhibits a delay from the time of input to the time of output. This delay is a critical consideration in timing analysis, as the cumulative effect of individual timing delays over a large integrated circuit may be disabling to the overall design. Models of switching devices are developed to help predict operation of a circuit. Models vary according to the circuit application and manufacture. Models of circuits which operate at low frequency ignore many of the high frequency effects.

One embodiment of the present invention incorporates the Miller effects on timing delays into a model of a switching circuit. The present invention represents the Miller capacitance as a capacitor in the model of a switching device and defines a Miller coefficient which accounts for the Miller effect's resultant overshoot. This method of incorporating the Miller effects can be applied to a variety of modeling methods.

One of the widely used switching device models for timing analysis is called the "CRYSTAL" delay model and is illustrated in FIG. 3. The CRYSTAL model is a well known model and is easily applied to switching circuits. The CRYSTAL model represents a switching device as an effective linear resistance ($R_{eff}$) 24. Determination of model values is done by characterization (i.e. test simulation technique.) This characterization involves evaluating relationships within the circuit. The fundamental relationships in a switching device involve switching times. For example, "rise time ratio" refers to the relationship between the input switching time and the output switching time, in response to a step input. The value of $R_{eff}$ 24 for a given circuit is characterized as a function of the rise time ratio. Note that the CRYSTAL model does not explicitly consider Miller effects.

The present invention may be applied to any number of switch level models. One embodiment of the present invention, illustrated in FIG. 4, incorporates the Miller effect into a CRYSTAL model, where the CRYSTAL model is enhanced by the addition of dynamic parameters simulating the Miller effect. Two new dynamic parameters describe the Miller effect. Miller capacitance ($C_\mu$) 7 with units of capacitance, and $\alpha$ 8, which is a unitless ratio. Both $C_\mu 7$ and $\alpha$ 8 are characterized as a function of input switching time 13.

Variable $\alpha$ 8 is used to model the time of occurrence of maximum overshoot as a fraction of input switching time. Referring to FIG. 2, maximum overshoot occurs at point A 17. The purpose of $C_\mu 7$ is to model the coupling between input and output nodes as a linear capacitance. These two parameters are incorporated to accurately simulate the physical relationships in the switching device.

Typically, a ramp voltage is applied at the gate of a single MOSFET or stage as in FIG. 1 where stage 3 is a single NMOS device. Load capacitor $C_{load}$ 15 discharges through stage 3. The present invention models stage 3 as a switch, which opens at time $T_d$, an effective resistance, $R_{eff}$ 24, and Miller capacitance, $C_\mu 7$. The methods for determining the values of each parameter vary with the MOSFET model configuration.

In one embodiment of the present invention, a MOSFET model is enhanced with the Miller parameters to describe one stage of a circuit. The enhanced model is illustrated in FIG. 4 where the switch is defined as:

OFF for $0 \leq t \leq \alpha\, T_{input}$

ON for $\alpha\, T_{input} < t$ where $T_{input}$ is defined as input switching time.

Initially, a characterization is done to determine the Miller capacitance in the circuit. Next, $T_d$ and $R_{eff}$ 24 are characterized or calculated. Note that characterization allows for stable parameters over a range of operating conditions. Characterization typically involves varying the input and capacitive load and recording the delays which are then used to find an equivalent resistance that will give the same results. Applying the obtained values to the original MOSFET model, a computation is done for the stage without incorporating the Miller effects and which yields the delay called $D_1$. Applying the obtained values to the enhanced MOSFET linear model, a computation is done to yield the delay of the stage while incorporating the Miller effects and which is called $D_2$. Now, applying the obtained values to the enhanced MOSFET linear model, a computation is done to yield the delay of the stage without incorporating the Miller effects and is called $D_3$. The calculation of the final delay of the stage is illustrated in a flow chart of FIG. 8 and is completed by the following equation:

final delay = $D_1 * (D_2/D_3)$

In one embodiment, the present invention uses the CRYSTAL model to calculate timing delays in a circuit. The CRYSTAL model represents a switching device as an effective linear resistance as in FIG. 3 and is defined by "rise time ratio", which is the input switching time divided by the output switching time in response to a step input. The enhanced CRYSTAL model includes $\alpha 8$ which is dimensionless. In this model, one effect of $C_\mu 7$ is to increase the output voltage's final time constant from ($R_{eff}$ 24) * ($C_{load}$ 15) in the original CRYSTAL model to ($R_{eff}$ 24) * ($C_{load}$ 15+$C_\mu 7$). Initially, a characterization is done to determine the Miller capacitance 7 in the circuit. Next, $T_d$ and $R_{\textit{eff}}$ 24 are characterized or calculated.

In one embodiment of the present invention, test simulations are run to characterize model parameters using many different values of device width, $T_R$, and output load capacitance, $C_{load}$ 15. This allows parameter values corresponding to each individual simulation to be calculated based on measurement data from each particular simulation and sets of parameter values corresponding to individual simulations to be globally characterized by fitting to polynomial functions.

In one embodiment, the value of $\alpha$ 8 for an individual simulation is calculated by dividing the measured time of maximum voltage overshoot by the input switching time. Given $\alpha 8$, the value of $C_\mu 7$ for an individual simulation can be obtained by equating the model value of the maximum normalized voltage overshoot, defined as:

$$(C_\mu * \min(\alpha,1))/(C_{load}+C_\mu)$$

to the measured value and explicitly solving for $C_\mu$. Given $\alpha$ 8 and $C_\mu 7$, the value of $R_{\textit{eff}}$ 24 for an individual simulation can then be obtained by equating the model value of time when the output voltage transition is 50% complete to the measured value, $t_{50}$, and solving for $R_{\textit{eff}}$ 24. For example, if $\alpha \geq 1$, an explicit solution is possible:

$$R_{\textit{eff}} = (t_{50} - \alpha\, T_{input})/\{\log|2\,(1+(C_\mu/(C_{load}+C_\mu)))|\}(C_{load}+C_\mu)$$

and if $\alpha<1$, $R_{\textit{eff}}$ is implicitly defined, and solved by an iterative numerical solution as:

for $\alpha\, T_{input} < t_{50} < T_{input}$:

$$0.5 = R_{\textit{eff}} C_\mu / T_{input} + |1 + \alpha C_\mu/(C_{load}+C_\mu) - R_{\textit{eff}} C_\mu / T_{input}| e^{-(A)}$$

where $A = (t_{50} - \alpha T_{input})/R_{\textit{eff}}(C_{load}+C_\mu)$ for $T_{input} < t_{50}$:

$$0.5 = R_{\textit{eff}} C_\mu / T_{input} + |1+\alpha C_\mu/(C_{load}+C_\mu) - R_{\textit{eff}} C_\mu / T_{input}| e^{-(B)}$$

where $B = (t_{50} - T_{input})/[R_{\textit{eff}}(C_{load}+C_\mu)]$

Additionally when $\alpha<1$, a check on self-consistency of the model can be made after each $R_{\textit{eff}}$ 24 solution to verify:

$$[1+\alpha C_\mu/(C_{load}+C_\mu)] \geq [R_{\textit{eff}} C_\mu / T_{input}]$$

If this condition is not true, then a modeling assumption that maximum voltage overshoot occurs at $t=(\alpha\ 8)*(T_{input}\ 13)$ is violated. In practice, this model typically satisfies self-consistency.

After determining values for $\alpha$ 8, $C_\mu 7$, and $R_{\textit{eff}}$ 24 from each individual simulation, a polynomial fit for the global characterization of each parameter can be performed using standard numerical techniques. In one embodiment, a numerical method automatically determines the optimal choice of degree and generates an orthogonal basis tailored to the data being fitted.

The present invention incorporates the Miller effects into timing calculations for switching devices and may be applied to any number of models. Another model is the Sakurai MOSFET model, which does not explicitly consider Miller effects. In one embodiment, the present invention uses the Sakurai MOSFET model to calculate timing delays in a circuit, where Miller capacitance, $C_\mu 7$, is estimated from circuit simulation outputs. The original Sakurai MOSFET model is used to calculate the 50%—50% timing delay for the circuit, first with a given value of load capacitance, $C_{load}$ 15 and second with the load capacitance value halved. $T_d$ is defined as the delay of the switching for zero load and is obtained by linear extrapolation of the two previous delays. Likewise $R_{\textit{eff}}$ 24 is computed based on the Sakurai MOSFET model delays by solving implicitly the following equations:

$$V_{norm}(T_{51}+(T_{R}/2)-T_d,R_{\textit{eff}},C_{load},T_R)=0.5$$

where $T_R$ represents rise time of an input signal and $V_{norm}$ is given as:

$$V_{norm}(t,R,C,T) = t/T - RC(1-e^{-t/RC})/T \text{ for } t<T \text{ and}$$

$$V_{norm}(t,R,C,T) = 1 - RC(e^{-(t-T)/RC} - e^{-t/RC})/T \text{ for } t>T.$$

Upon completion of the parameter calculations, compute $D_1$, $D_2$, $D_3$, and the final delay using the MOSFET and enhanced MOSFET models.

In one embodiment of the present invention, computer processor 22 uses a computer program to calculate the parameters, evaluate the equations associated with a circuit, and store the resultant delays for application in circuit simulation routines, circuit design tools, circuit analysis tools, or any other computer analysis tool. In one embodiment, computer processor 22, provides calculated timing delays to design interface 35, which uses the information in building design files. In alternate embodiments, design interface 35 includes a circuit simulation program. Circuit simulation, optimization and any other circuit design or analysis program may incorporate one or more model for switching circuits. The present invention is applicable to many models, allowing for accurate representation of a switching device or stage.

The present invention is applicable to many stages of circuit design, including timing analysis, path verification, dynamic and functional design verification, and optimization. Accurate modeling is key to each area of circuit design. During circuit design, circuit simulation and circuit analysis tools provide feedback to the designer as to the feasibility and efficiency of his design. In one embodiment of the present invention, Miller effects are incorporated into timing delay calculations which are provided to a timing simulator 118, as in FIG. 7. Timing delays and circuit information are provided to simulation routines 120. In one embodiment of the present invention, simulation routines 120 are used to verify a design both functionally and dynamically. Incorporation of the Miller effects allows a designer confidence that simulation results accurately reflect the physical circuit. In alternate embodiments, Miller effect calculations may be incorporated at any stage of circuit design or simulation.

In one embodiment of the present invention, illustrated in flow chart form in FIG. 7, computer processor 22 uses path-tracing routines 108 to calculate the potential signal paths and timings in each circuit design. Path-tracing routines 108 are used to locate those paths that limit clock periods and/or violate timing constraints. As complicated integrated circuits are costly to manufacture, accurate path-tracing routines 108 are critical to efficient circuit design. One embodiment of the present invention calculates the timing delays for each stage of a design, incorporating the Miller effects, and provides these timings to path-tracing routines 108.

Optimization of circuit design is often used to reduce manufacturing costs. Methods of design may introduce inefficiencies into a circuit design. For example, a circuit designer may build a new circuit using building blocks from known circuits (i.e. functional portions of a circuit, such as adders, timers, OR gates, etc.) Such building blocks are often contained in a library according to function. Redundancy and overlap in circuit design is intrinsic to such a building block approach, but the reduced design time may outweigh the negatives and inefficiency. To improve a design, as in FIG. 5, optimization routines 126 may be part of a MOSFET-level optimizer 124. In one embodiment of the present invention, optimization routines 126 incorporate the Miller effects into circuit calculations. Consideration of Miller capacitance and Miller effects, allows improvement of circuit design and identification of inefficient designs.

The present invention incorporates the Miller effects into timing calculations for switching devices. In one embodiment, addition of a Miller capacitance and Miller coefficient allow accurate modeling of a switching device. The present invention considers both the effective delay and overshoot of the Miller effect. It is applicable to many circuits and may include integrated circuits, linear amplifiers, feedback controlled amplifiers, and circuits with coupling capacitance. The Miller effect is present in each of these circuits. The present invention is applicable to various models.

In one embodiment of the present invention, application of the Miller compensation calculations is illustrated in FIG. 8. Starting with processing the information and simulation data at step 200, the delay model is characterized, Miller capacitance 7 obtained, and parameters calculated or characterized. The resultant MOSFET delay model parameters are then applied to the model. This information is added to other particular characteristics of a given circuit. Computer processor 22 then computes a first delay, without Miller capacitance 7. A second delay is calculated using a linear model incorporating Miller capacitance 7, and then a third timing delay using the linear model without Miller capacitance 7. The value of α 8 is calculated, which allows circuit delay calculation. This information is then available for other modules and routines. Note that some steps become redundant and others unnecessary depending on the MOSFET model used. Though FIG. 8 illustrates an exemplary flow, some steps may be combined or performed in an alternate sequence. Alternate embodiments incorporate additional steps which are specific to each application.

For application to high frequency circuits, the CRYSTAL model is overly simplistic for accurate modeling, and is therefore not robust. Application of the present invention to the CRYSTAL model allows for robust time delay calculations of high frequency circuits. Where the Sakurai model is limited, application of the present invention provides accuracy. The present invention offers an accurate, robust method for calculating the timing delays in a circuit and aids in circuit design.

While the present invention has been illustrated and described with reference to specific embodiments, further modifications and improvements will occur to those skilled in the art. It is to be understood, therefore, that this invention is not limited to the particular forms illustrated and that the appended claims cover all modifications that do not depart from the spirit and scope of this invention.

We claim:

1. A system embodied in a computer readable medium for calculating timing delays for integrated circuit design, the system comprising:

means for specifying at least one switching device in a circuit design, wherein operation of the at least one switching device is defined as:

OFF for $0 \leq t \leq a\, T_{input}$

ON for a $T_{input} < t$ where a is a function of the at least one switching device, and $T_{input}$ is defined as input switching time;

means for generating an representative configuration having a resistance and a Miller capacitance, the Miller capacitance having a Miller coefficient;

means for calculating timing delays for the at least one switching device using the representative configuration having the resistance and the Miller capacitance, where the Miller coefficient is used to calculate timing delays;

means for generating a circuit model according to the calculated timing delays; and means for outputting the circuit model.

2. A method for utilizing a data processor to design an integrated circuit, wherein said integrated circuit contains at least one switching device, said method comprising:

receiving circuit description information;

determining the model configuration for at least one switching device, where the model configuration has a switch, an effective resistance, $R_{eff}$ and a Miller Capacitance, $C_\mu$, and an associated Miller coefficient;

determining values for $R_{eff}$ and $C_\mu$;

storing values for $R_{eff}$ and $C_\mu$ in a first memory;

retrieving said values for $R_{eff}$ and $C_\mu$ from the first memory;

calculating at least one timing delay for the at least one switching device using the model configuration, the associated Miller coefficient, and said values for $R_{eff}$ and $C_\mu$;

modifying the model configuration according to the at least one timing delay to form a modified model configuration; and determining a circuit design based on the model configuration and the at least one timing delay;

wherein operation of the at least one switching device is defined as:

OFF for $0 \leq t \leq a\, T_{input}$

ON for a $T_{input} < t$ where a is a function of the at least one switching device, and $T_{input}$ is defined as input switching time.

3. A method as in claim 2, further comprising:

storing the associated Miller coefficient in the first memory.

4. A method as in claim 2, further comprising:

storing the at least one timing delay in the first memory.

5. A method as in claim 2, further wherein the first memory is a register.

6. A method as in claim 2, wherein determining values for $R_{eff}$ and $C_\mu$ further comprises the steps of:

performing a circuit simulation for a set of variables which includes device width, input switching time, $T_{input}$, and output load capacitance, $C_L$;

comparing results of the circuit simulation to measured data for the set of variables; and calculating $R_{eff}$, $C_\mu$, and total timing delay, $T_d$.

7. A method as in claim 6, further comprising the steps of:

obtaining a first timing delay, $D_1$, where the model configuration is a MOSFET model devoid of Miller capacitance effects;

obtaining a second timing delay, $D_2$, where the model configuration is a model which includes $C_\mu$, incorporating Miller capacitance effects;

obtaining a third timing delay, $D_3$, where the model configuration is the model which includes $C_\mu$, but is devoid of Miller capacitance effects;

calculating the associated Miller coefficient as a function of $D_2$ and $D_3$; and calculating $T_d$ as a function of $D_1$ and the associated Miller coefficient.

8. A method as in claim 6, wherein the step of calculating $C_\mu$ further comprises the steps of:

calculating $\alpha$ as a function of a maximum overshoot and $T_{input}$ for each set of variables; and calculating $C_\mu$ using a model overshoot value given as: $(C_\mu*\min(\alpha,1))/(C_\mu+C_L)$;

wherein the step of comparing the circuit simulation results comprises the step of:

obtaining a polynomial fit for a global characterization of each parameter.

9. A method as in claim 6, wherein calculating $R_{eff}$, $C_\mu$, and total timing delay, $T_d$ further comprises the steps of:

estimating $C_\mu$ using circuit simulation results;

obtaining a first 50%—50% delay, $T_{S1}$, using a Sakurai type MOSFET model with a predetermined value for $C_L$;

obtaining a second 50%—50% delay, $T_{S2}$, using the Sakurai type MOSFET model with half of the predetermined value for $C_L$;

calculating $T_d$ as:

$T_d = (2*T_{S2}) - T_{S1}$;

computing a value for $R_{eff}$ using the Sakurai type MOSFET model, by solving:

$V_{norm}(T_{S1}+(T_R/2))-T_d,R_{eff}C_L,T_R)=0.5$, where $T_R$ represents rise time of an input signal and $V_{norm}$ is given as:

$V_{norm}(t,R,C,T)=t/T-RC(1-e^{-t/RC})/T$ for $t<T$ and $V_{norm}(t,R,C,T)=1-RC(e^{-(t-T)/RC}-e^{-t/RC})/T$ for $t>T$.

10. A method as in claim 2, further comprising:

describing a second switching device as the model configuration;

determining values for $R_{eff}$ and $C_\mu$;

calculating timing delays in the second switching device using the model configuration, the associated Miller coeffient, and determined values for $R_{eff}$ and $C_\mu$; and providing calculated timing delays to the data processor.

11. A method as in claim 10, further comprising:

providing said calculated timing delays for the at least one switching device and the second switching device to a path tracing computer program.

12. A method as in claim 11, wherein the path tracing computer program uses said calculated timing delays to locate timing violations.

13. A method as in claim 11, wherein the path tracing computer program uses said calculated timing delays to determine clock period limiting paths in the circuit.

14. A method as in claim 11, further comprising:

providing said calculated timing delays for the at least one switching device and the second switching device to a circuit simulation computer program.

15. A method as in claim 14, wherein the circuit simulation computer program performs dynamic functionality verification for the circuit.

16. A method as in claim 11, further comprising:

providing said calculated timing delays for the at least one switching device and the second switching device to an optimization computer program.

17. A method as in claim 2, wherein the data processor utilizes a computer program.

18. The method as in claim 17, wherein the computer program is stored on a computer readable medium.

19. A method for utilizing a data processor to simulate an integrated circuit, wherein said integrated circuit contains at least one switching device, said method comprising:

describing said at least one switching device as a model configuration having a switch, an effective resistance, $R_{eff}$ and a Miller Capacitance, $C_\mu$;

determining values for $R_{eff}$ and $C_\mu$;

calculating timing delays in the at least one switching device using the model configuration and determined values for $R_{eff}$ and $C_\mu$, wherein operation of the at least one switching device is defined as:

OFF for $0 \leq t \leq a\, T_{input}$

ON for $a\, T_{input} < t$ where a is a function of the at least one switching device, and $T_{input}$ is defined as input switching time;

providing calculated timing delays to the data processor; and simulating operation of the circuit using the calculated timing delays and the model configuration.

20. A method as in claim 19, wherein the data processor utilizes a computer program.

21. A method as in claim 20, wherein the computer program is stored on a computer readable medium.

22. A computer system, comprising:

a circuit simulation tool, comprising:

an input means, the input means receiving circuit description information which describes a circuit having at least one switching device;

a memory storage unit storing a computer program, said computer program responsive to the circuit description information, said program calculating timing delays in the at least one switching device using a model configuration having a switch, an effective resistance, $R_{eff}$ a Miller Capacitance, $C_\mu$, and an associated Miller coefficient, said program providing timing delays for the circuit as an output;

a computer processor, the computer processor operating under control of the computer program to simulate a circuit; and an output means, the output means providing results of circuit simulation from the computer processor to a computer readable medium;

wherein operation of the at least one switching device is defined as:

OFF for $0 \leq t \leq a\, T_{input}$

ON for $a\, T_{input} < t$ where a is a function of the at least one switching device, and, $T_{input}$ is defined as input switching time.

23. The circuit simulation tool as in claim 22, further comprising a path tracing routine which receives the output.

24. The circuit simulation tool as in claim 22, further comprising a circuit simulation routine which receives the output.

25. The circuit simulation tool as in claim 22, further comprising an optimization routine, which receives the output.

26. The circuit simulation tool as in claim 22, wherein said model configuration is reduced to equations describing the model configuration.

27. A method for designing a circuit, the circuit having at least one switching device, the method comprising the steps of:

- accessing a program file stored in computer memory, the file containing several program statements wherein a plurality of the program statements are to be executed by a central processing unit (CPU);
- parsing the program file to produce a representation of the program statements contained in the program file, the representation being stored in computer memory;
- identifying, from the representation in computer memory, the plurality of program statements which is to be executed by the CPU;
- identifying, from the representation in computer memory, the plurality of program statements which is to be executed by the CPU;
- accessing description information associated with a first circuit, the description information having a form compatible with the program file;
- creating a first model configuration for the first circuit, the model configuration having at least one switching device, an effective resistance, $R_{eff}$, a Miller Capacitance, $C_\mu$, and an associated Miller coefficient;
- determining values for $R_{eff}$ and $C_\mu$;
- storing values for $R_{eff}$ and $C_\mu$ in a first memory;
- retrieving said values for $R_{eff}$ and $C_\mu$ from the first memory;
- calculating at least one timing delay for the at least one switching device using the model configuration, the associated Miller coefficient, and said values for $R_{eff}$ and $C_\mu$;
- modifying the model configuration to incorporate the at least one timing delay to form a modified model configuration;
- providing the modified model configuration to the data processor; and
- determining a circuit design from the modified model configuration and the at least one timing delay;

wherein operation of the at least one switching device is defined as:

OFF for $0 \leq t \leq a\, T_{input}$

ON for $a\, T_{input} < t$ where a is a function of the at least one switching device, and $T_{input}$ is defined as input switching time.

* * * * *